(12) United States Patent
George

(10) Patent No.: US 6,317,657 B1
(45) Date of Patent: Nov. 13, 2001

(54) METHOD TO BATTERY BACK UP SDRAM DATA ON POWER FAILURE

(75) Inventor: Geeta George, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/136,254

(22) Filed: Aug. 18, 1998

(51) Int. Cl.$^7$ .................................. H02J 1/14; H02H 7/00
(52) U.S. Cl. ..................... 700/286; 700/292; 700/293; 700/295; 700/296; 700/297; 700/298; 711/106; 713/300; 713/340; 365/222; 365/223; 365/226; 365/229
(58) Field of Search .................................. 700/286, 292, 700/293, 295, 296, 297, 298; 713/300, 340; 711/106; 365/222, 233, 226, 229; 714/7

(56) References Cited

U.S. PATENT DOCUMENTS

| 5,229,970 | * | 7/1993 | Lee et al. ........................ 365/222 |
| 5,323,354 | * | 6/1994 | Matsumoto et al. ............... 365/229 |
| 5,627,791 | * | 5/1997 | Wright et al. .................... 365/222 |
| 5,630,090 | * | 5/1997 | Keehn et al. ..................... 711/106 |
| 5,640,357 | * | 6/1997 | Kakimi ............................ 365/229 |
| 5,673,233 | * | 9/1997 | Wright et al. .................... 365/233 |
| 5,751,652 | * | 5/1998 | Tomita ........................... 365/226 |
| 5,880,987 | * | 3/1999 | Merritt ........................... 365/51 |
| 5,923,829 | * | 7/1999 | Ishii et al. ....................... 714/7 |
| 6,088,762 | * | 7/2000 | Creta ............................. 711/106 |

* cited by examiner

Primary Examiner—Ayaz Sheikh
Assistant Examiner—Frantz B. Jean
(74) Attorney, Agent, or Firm—Flehr Hohbach Test Albritton & Herbert LLP

(57) ABSTRACT

A system and method for providing battery back-up of SDRAM data upon power failure in which a power-down event is detected early and system hardware configures SDRAM self-refresh circuitry to set the SDRAM to a self refresh mode in which the SDRAM issues a single-refresh command just before system power drops below a safe threshold level and keeps the SDRAM in self-refresh mode after the system power drops by holding low a SDRAM clock enable signal using battery power. One embodiment for use with an external SDRAM controller includes a self-refresh control module (SRCM) and a battery backup module (BBUM). The BBUM includes power-down detection hardware and a battery for backing-up the SDRAM. In response to signals from the external SDRAM controller and the BBUM the self-refresh module generates SDRAM control signals for transitioning the SDRAM smoothly from normal mode to self-refresh mode during power-down events and vice-versa. The signals from the BBUM include an early power-down signal PDN that is asserted whenever power is about to go down. The signals from the external SDRAM controller include an auto-refresh signal that is asserted whenever the SDRAM controller initiates an auto-refresh operation.

17 Claims, 3 Drawing Sheets

METHOD TO BATTERY BACK UP SDRAM DATA ON POWER FAILURE

The present invention relates generally to power failure protection for synchronous dynamic RAMs (SDRAMS) and, particularly, to battery backup systems and methods for SDRAMS.

BACKGROUND OF THE INVENTION

Synchronous Dynamic RAMs (SDRAMs) have become a popular type of dynamic memory due to their speed of operation and ease of use. SDRAMs are used in motherboards, embedded products such as RAID controllers, routers, Ethernet controllers and other systems that employ memory. Some of these products, such as RAID controllers, cannot afford to lose memory data upon power failure. In these products memory is backed-up by battery during power failures so the stored data can be continually refreshed, allowing the stored data to be available when power is restored.

In one type of battery backup system only the memory is backed-up during power failures. As a result, the required battery is small and can be positioned near the memory in products with space constraints.

There are three possible prior art methods by which SDRAM can be backed up by battery. In the first method a power-down event is detected early (i.e., before the SDRAM has lost its stored data) and system software configures auto-refresh circuitry to set the SDRAM in an auto-refresh mode in which auto-refresh cycles are given periodically as long as system power is off and power to the memory is provided by battery.

In the second method a power-down event is detected early and system hardware configures auto-refresh circuitry to set the SDRAM in an auto-refresh mode in which auto-refresh cycles are given periodically as long as system power is off and power to the memory is provided by battery.

In the third method a power-down event is detected early and system software configures SDRAM self-refresh circuitry to set the SDRAM in a self-refresh mode in which a self refresh command is given anytime system power falls below a threshold level. The self-refresh command is supported by most SDRAMs with proprietary circuitry.

A disadvantage of the first and second methods is that the battery has to drive the control signals to the SDRAM for auto-refreshing, which discharges the battery faster and hence reduces battery life.

The third method, which uses the SDRAM self refresh mode, requires the system software to issue only a single self-refresh command to the SDRAM before the power goes down. As a result, no SDRAM control signals need to be driven by the battery during the power outage, which preserves battery life. A disadvantage of this method is that the software has to stop all activities and place the SDRAM in self-refresh mode before the power falls below the threshold voltage. However, the software may be executing uninterruptable tasks, in which case it might be difficult for the software to place the SDRAM in self-refresh mode in the available time.

SUMMARY OF THE INVENTION

The present invention is a system and method for providing battery back-up of SDRAM data upon power failure. More particularly, the present invention is a battery back-up system and method in which a power-down event is detected early and system hardware configures SDRAM self-refresh circuitry to set the SDRAM to a self refresh mode in which the SDRAM issues a self-refresh command just before system power drops below a safe threshold level and keeps the SDRAM in self-refresh mode when the SDRAM is powered by battery power.

One system embodiment for use with an external SDRAM controller includes a self-refresh control module (SRCM) and a battery backup module (BBUM). The BBUM includes power-down detection hardware and a battery for backing-up the SDRAM. In response to signals from the external SDRAM controller and the BBUM the self-refresh module generates SDRAM control signals for transitioning the SDRAM smoothly from normal mode to self-refresh mode during power-down events and vice-versa. The signals from the BBUM include an early power-down signal PDN that is asserted whenever power is about to go down. The signals from the external SDRAM controller include an auto-refresh signal that is asserted whenever the SDRAM controller initiates an auto-refresh operation.

The self-refresh module, after receiving the asserted PDN signal, initiates a self-refresh operation after receiving the next assertion of the auto-refresh signal. This is a safe time to perform a self-refresh operation as the external SDRAM controller asserts the auto-refresh signal when there is sufficient time for the self-refresh module to switch to self-refresh mode and when no data operations would be interrupted. The self-refresh module initiates the self-refresh operation via SDRAM control signals, such as a clock enable, chip selects, a row address strobe (RAS), a column address strobe (CAS) and a write enable.

In one embodiment the auto-refresh signal is a chip select signal that is not used by the SDRAM and is activated only for the auto-refresh command (i.e., it is not used for any data accesses). As a result of employing the unused chip select line to carry the auto-refresh signal the load impedances of the actual control signals used by the SDRAM are not disturbed. This enables the SDRAM to achieve the speed for which the External Memory Controller (EMC) is designed. Another benefit of employing the single, unused, EMC chip select as the auto-refresh signal is that the auto-refresh state can be detected from a single control line rather than from a combination of several control lines, which simplifies the self-refresh module circuitry.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
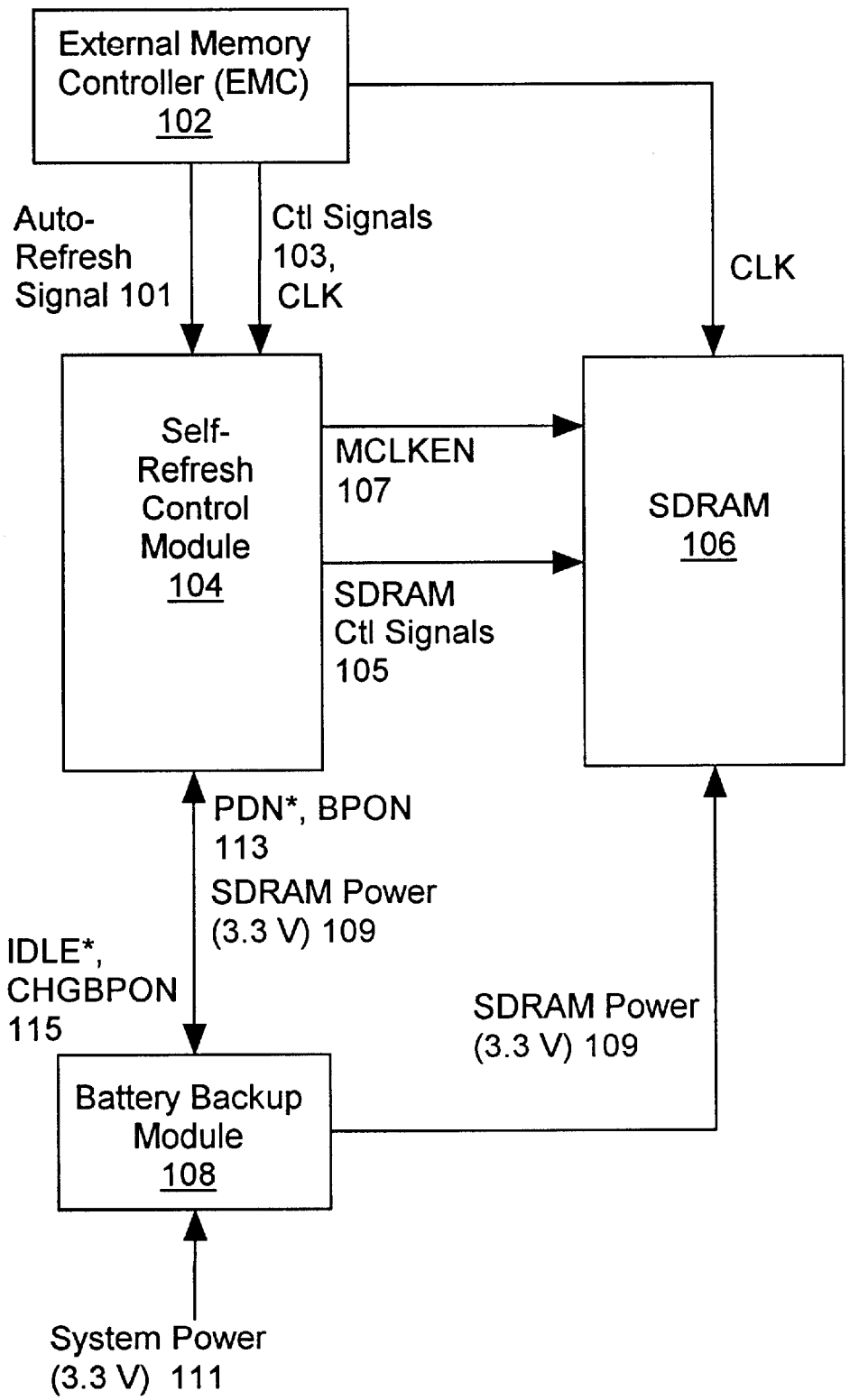
FIG. 1 is a block diagram of one embodiment.

Referring to FIG. 1, there is shown a block diagram of one embodiment of an SDRAM battery-backup module implemented in accordance with the present invention that includes an external memory controller (EMC) 102, self-refresh control module (SRCM) 104 and a battery backup module 108 (BBUM). The external memory controller 102 provides the SRCM 104 with an auto-refresh signal 101, EMC control signals 103 and a clock CLK, which is also coupled to the SDRAM 106. The BBUM 108 receives IDLE* (hereinafter, an asterisk "*" denotes active low signals) and CHGBPON signals 115 from the SRCM 104 and provides the SRCM 104 with early power-down (PDN*) and battery power-on (BPON) signals 113. The BBUM 108 also receives a 3.3V system power signal 111 and provides a 3.3V SDRAM power signal 109 to the SDRAM 106 and the SRCM 104. The SRCM 104 controls the SDRAM 106 using the SDRAM clock enable signal (MCLKEN) 107 and other SDRAM control signals 105 (e.g., RAS, CAS, chip selects, write enable).

The BBUM 108 continually monitors the system power signal 111 and asserts the PDN* signal as soon as it becomes apparent that a system power failure is imminent (e.g., when the voltage of the signal 111 falls below a particular threshold). After receiving the asserted PDN* signal the SRCM 104 asserts the IDLE* signal when it is safe to transition to battery backup. In response to assertion of the IDLE* signal the BBUM 108 begins to supply the SDRAM with 3.3V SDRAM power 109 from a battery contained within the BBUM 108 and asserts the BPON signal, which tells the SRCM 104 that the switch has been made from system power to battery power. The BBUM 108 deasserts the PDN* signal when the system power signal 111 has been restored. The SRCM 104 asserts the CHGBPON signal after determining that it is safe to switch back to system power. In response, the BBUM 108 switches the SDRAM power back to system power and deasserts the BPON signal.

The EMC 102 generates control signals 103 (e.g., CAS, RAS, chip selects, and clock) for controlling the SDRAM 106. In contrast with prior art memory controllers, the EMC control signals 103 are not coupled directly to the SDRAM 106 but are input to the SRCM 104. The SRCM either uses the EMC control signals 103 (in normal mode) or generates its own control signals (in self-refresh/battery-backup mode). Depending on the mode, an appropriate one of the control signal sets is output by the SRCM 104 as the SDRAM control signals 105. During normal operation the EMC 102 outputs an auto-refresh signal 101 to the SRCM 104. The EMC 102 asserts the signal 101 only for auto-refresh and not for data operations. This signal 101 is used by the SRCM 104 to determine when it is safe to initiate a self-refresh mode.

In the illustrated embodiment the auto-refresh signal 101 is provided by the EMC 102 on a redundant chip select line (i.e., a line whose associated chip select signal is not included in the SDRAM control signals 105). As a result of employing the unused chip select line to carry the auto-refresh signal the load impedances of the actual control signals used 105 by the SDRAM 106 are not disturbed. This enables the SDRAM 106 to achieve the speed for which the External Memory Controller (EMC) 102 is designed. The method of operation embodied in the SRCM 104 is now described in reference to FIG. 4.

Figure 4:
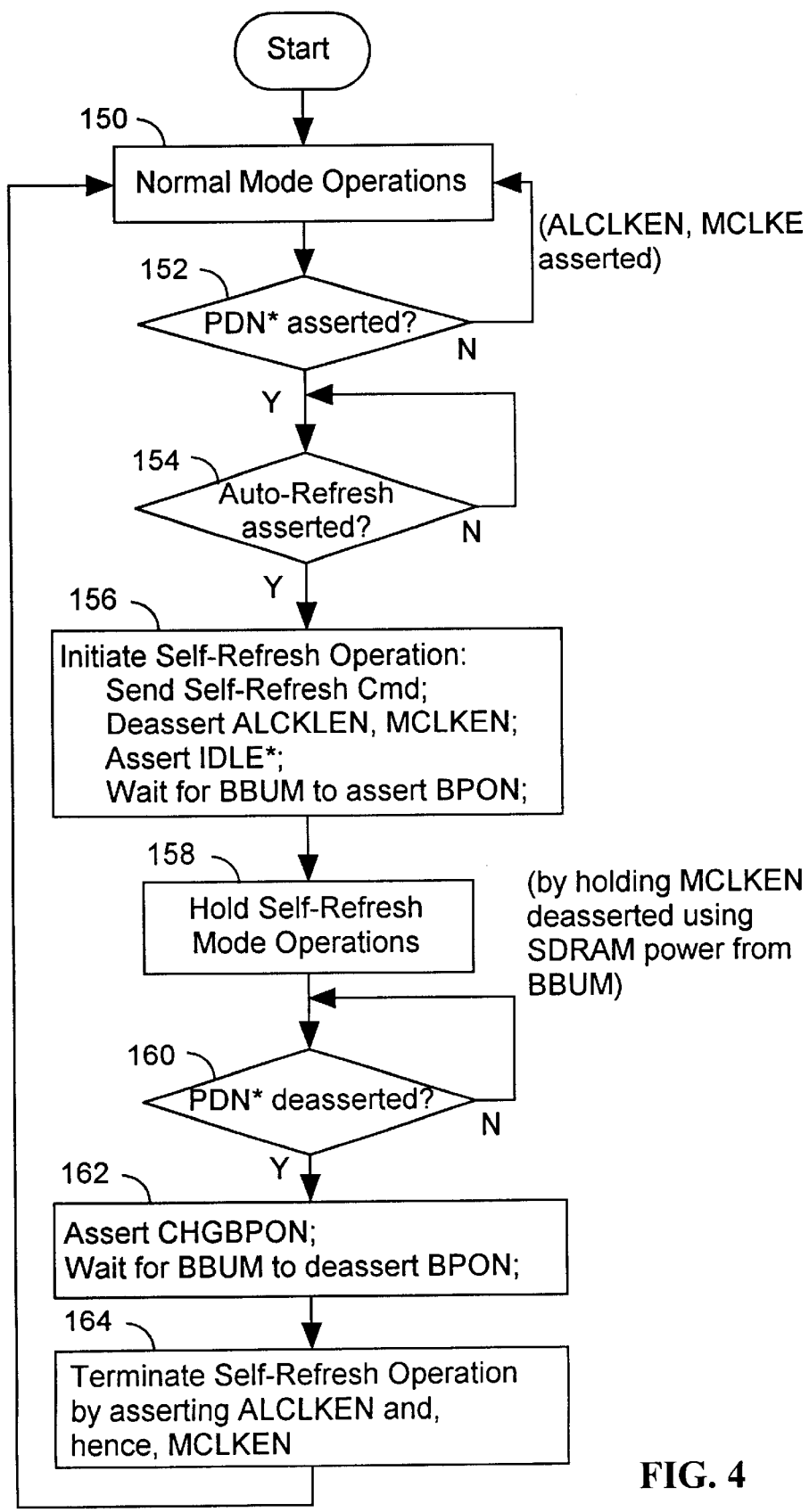
FIG. 4 is a flow chart showing steps of a method implemented in the embodiments of FIGS. 2 and 3.

FIG. 4 shows a flow chart of a method implemented in the embodiment of FIG. 1. This flow chart depicts the relationship between the two modes of operation (normal and self-refresh) of one embodiment. In normal mode the system power 111 is available and the EMC 102 is responsible for controlling all operations of the SDRAM 106. In this mode the SRCM 104 simply couples the EMC control signals 103 to the SDRAM 106 as the SDRAM control signals 105 (step 150) and the MCLKEN signal 107 remains asserted to enable normal SDRAM operation. The SRCM 104 initiates the transition from normal mode to self-refresh mode when the BBUM 108 asserts the PDN* signal (152-Y). Upon receiving the asserted PDN* signal, the SRCM 104 determines a safe time for the transition by waiting for an auto-refresh cycle from the EMC 102 (154). Once the auto-refresh signal 101 is asserted (154-Y), the SRCM 104 initiates self-refresh operations by asserting the self-refresh command on the SDRAM control signals 105 and deasserting an internal signal (ALCLKEN, FIG. 2) that in turn causes the MCLKEN signal 107 to be deasserted (156). (The SDRAM 106 enters self-refresh mode when the MCKLEN signal is deasserted with the self-refresh command on SDRAM control lines.) The SRCM 104 then asserts the IDLE* signal and awaits the BPON signal, which indicates that battery power is being supplied to the SDRAM (156).

While the BPON signal is asserted the SRCM 104 keeps the SDRAM in self-refresh mode by keeping the MCLKEN signal 107 deasserted (158). The SRCM 104 does this using a zero delay switch SW2 (FIG. 2) that switches the ALCKLEN signal (deasserted during self-refresh operations) onto the MCKLEN signal 107 whenever the BPON signal is asserted. This switch SW2 is able to operate during power outages because it is driven by battery power (via the SDRAM power signal 109) provided by the BBUM 108.

When the PDN* signal is deasserted (160-Y), indicating the return of system power, the SRCM 104 asserts the CHGBPON signal, which tells the BBUM 104 to switch the SDRAM power 109 back to system power from battery power, and then waits for the BBUM 108 to deassert the BPON signal (162). Once the BPON signal is deasserted, the SRCM 104 terminates self-refresh mode hold by asserting the ACLKEN signal and therefore the MCLKEN signal 107 (164). The SRCM then transitions back to normal mode operations (150).

Figure 2:
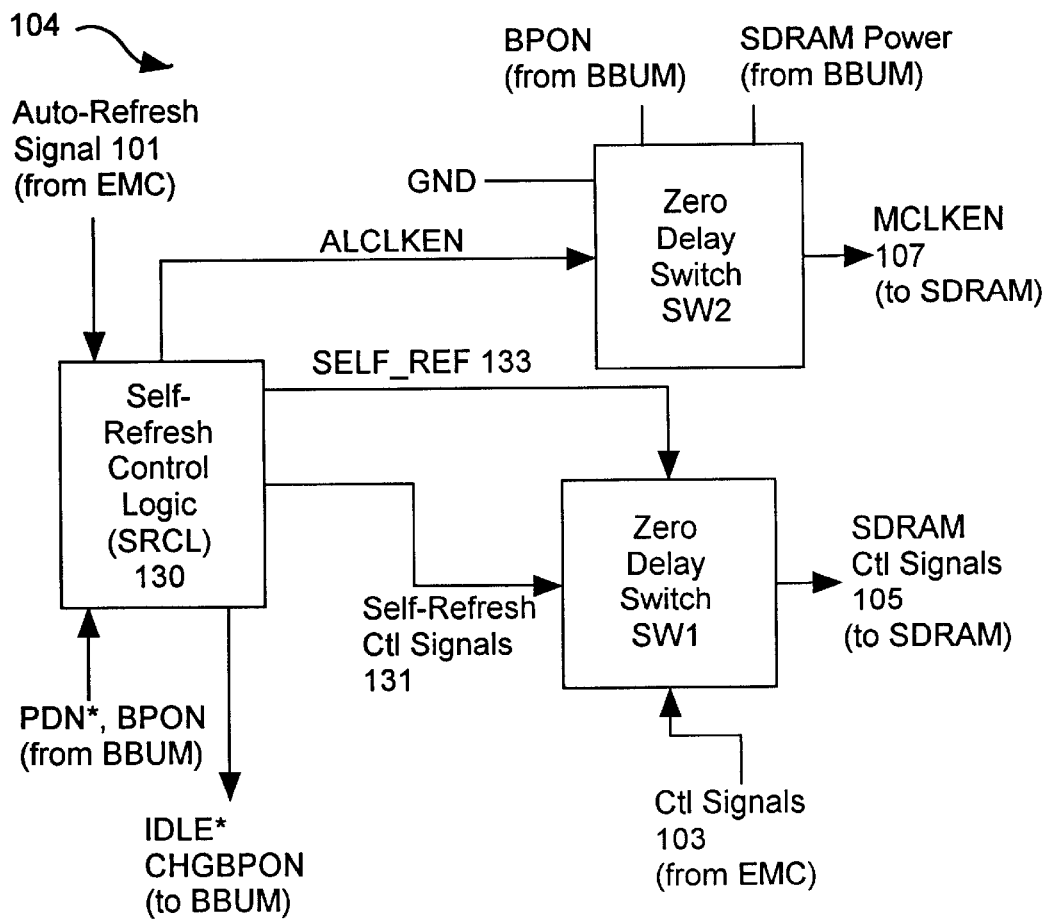
FIG. 2 is a block diagram of the self-refresh control module of FIG. 1.
Figure 3:
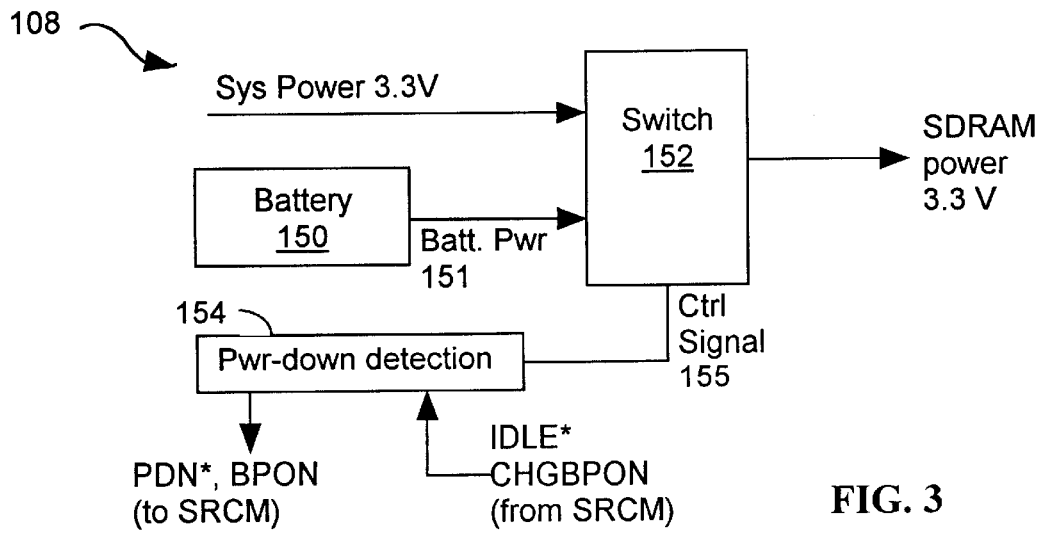
FIG. 3 is a block diagram of the battery backup module of FIG. 1.

Specific embodiments of the SRCM 104 and the BBUM 108 are now described in reference to FIGS. 2 and 3. These embodiments are only one possible implementation of and are not to be construed to limit the scope of the present invention.

Referring to FIG. 2, there is shown a block diagram of one embodiment of the SRCM 104 that includes self-refresh control logic (SRCL) 130 and two zero delay switches SW1, SW2. The SRCL 130 receives the auto-refresh signal 101 from the EMC 102 and the PDN* and BPON signals from the BBUM 104. The SRCL 130 outputs the IDLE* and CHGBPON signals to the BBUM 108, an ALCLKEN signal to the switch SW2 and self-refresh mode (SELF_REF) and control signals 133, 131 to the switch SW1. The self-refresh control signals 131 include the following:

| | |
|---|---|
| srCS* | self-refresh chip select; |
| SrRAS* | self-refresh row address strobe; |
| srCS_RAS* | the combined SrCS* and SrRAS* signals; |
| SrCAS* | self-refresh column address strobe; and |
| srWE* | self-refresh write enable for self-refresh mode. |

It is beyond the scope of the present application to describe the generation of the control signals 131, as the control of dynamic memories using similar types of signals is well-known.

The switch SW2 couples either the GND signal or the ALCLKEN signal to the MCLKEN signal 107 depending on the state of a SW2 select signal BPON that is generated by the BBUM 108. The switch SW2 is a zero delay switch, meaning that its output changes almost immediately (i.e, asynchronously) following a change in its select signal. The switch SW2 is powered by the SDRAM power 109, which ensures that it will function even during system power outages. This immunity from power outages ensures that the MCLKEN signal can be held high for SDRAM normal operations (when system power is available) and held low when the SDRAM is in self-refresh mode (when only battery power is available). The ALCLKEN signal from the SRCL 130 ensures timing requirements on MCLKEN with respect to the SDRAM clock, CLK.

The switch SW1 couples either the self-refresh control signals 131 or the EMC control signals 103 to the SDRAM control signals 105 depending on the state of the SELF_REF mode signal 133. The switch SW1 is a zero delay switch, meaning that its output changes almost immediately (i.e., asynchronously) following a change in its select signal (i.e., the SELF_REF signal). The EMC control signals 103 include:

| | |
|---|---|
| mcCS0* | chip select 0; |
| mcCS1* | chip select 1; |
| mcCS2* | chip select 2 (serves as the auto-refresh signal 101); |
| mcRAS* | row address strobe; |
| mcCAS* | column address strobe; and |
| mcWE* | write enable |

In the illustrated embodiment the SDRAM control signals 105 include:

| | |
|---|---|
| CS0* | chip select 0; |
| CS1* | chip select 1; |
| CAS* | column address strobe; |
| RAS* | row address strobe; and |
| WE* | write enable. |

In normal mode, the switch SW1 couples the EMC signals mcCS0*, mcCS1*, mcRAS*, mcCAS* and mcWE* to the SDRAM control signals CS0*, CS1*, RAS*, CAS* and WE*. The only EMC signal 103 not output to the SDRAM 106 is the mcCS2* signal, which is used as the auto-refresh signal 101. In self-refresh mode the switch SW1 couples the self-refresh signals srCS_RAS*, srCAS* and srWE* to the SDRAM control signals CS0*, CS1*, RAS*, CAS* and WE* signals, respectively, where the srCS-RAS* signal is coupled to the CS0*, CS1* and RAS* signals.

The SRCL 130 generates the SELF_REF signal in accordance with the flow chart of FIG. 4. In particular, just after the completion of the step (154) and at the beginning of step (156), the SRCL 130 sets the SELF_REF signal to cause the switch SW1 to output the self-refresh signals 131. Just after the completion of the step (162) the SRCL 130 sets the SELF_REF signal to cause the switch SW1 to output the selected EMC signals 103. Once the self-refresh command is given in step (156), the SRCL 130 deasserts the ALCLKEN signal and hence the MCLKEN signal 107, which enables the SDRAM to enter self-refresh mode. Once MCLKEN is low, the state of the other control signals do not matter with respect to keeping the SDRAM in self-refresh mode.

Referring to FIG. 3 there is shown a block diagram of an embodiment of the BBUM 108 that includes a battery 150, switch 152 and power-down detection module 154. Inputs to the switch 152 include a power signal 151 from the battery 150 and the system power signal 111. The switch 152 switches one of its inputs to the SDRAM power 109 based on the state of the control signal 155 from the power down detection module 154.

Inputs to the power-down detection module 154 include the IDLE* and CHGBPON signals and the outputs from the power-down detection module 154 include the control signal 155 and the PDN* and BPON signals. The power detection module 154 asserts the control signal after receiving the asserted IDLE* signal from the SRCL 130, which causes the switch 152 to output the battery power signal 151 instead of the system power signal 111. When the IDLE* signal is not asserted the power detection module 154 keeps the control signal 155 deasserted, which causes the switch 152 to output the system power signal 111.

In the illustrated embodiment both power signals 111, 151 are at 3.3V to accommodate the requirements of the SDRAM 106 but they can be at any other voltage level.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A battery backup system for use with an SDRAM intended to operate from a system power supply, comprising:

a battery configured to provide a battery power signal;

a power monitor configured to detect status of the system power supply and, when the system power supply is about to fail, to generate a power down signal and subsequently supply the SDRAM with the battery power signal in lieu of the system power supply; and a self-refresh module configured, in response to the power down signal, to issue self-refresh control signals to the SDRAM that cause the SDRAM to perform a self-refresh operation without intervention of an external memory controller.

2. The battery backup system of claim 1, wherein:

the self-refresh module is configured to initiate self-refresh operations at a safe time when there are no active data operations being performed by the SDRAM.

3. The battery backup system of claim 2, wherein:

the self-refresh module determines the safe time by monitoring an auto-refresh signal generated by the external memory controller.

4. The battery backup system of claim 3, wherein the auto-refresh signal is provided via a chip select line from the external memory controller that is not used by the SDRAM.

5. A battery backup system for use with an SDRAM intended to operate from a system power supply, comprising:

a battery configured to Provide a battery power signal;

a power monitor configured to detect status of the system power supply and, when the system power supply is about to fail, to generate a power down signal and subsequently supply the SDRAM with the battery power signal in lieu of the system power supply; and a self-refresh module configured, in response to the power down signal, to issue self-refresh control signals to the SDRAM that cause the SDRAM to perform a self-refresh operation without intervention of an external memory controller, wherein the self-refresh module has a self-refresh circuit configured, in response to the power down signal, to determine a safe time and then, at the safe time, assert a battery power on signal that is coupled to the power monitor to direct the power monitor to begin powering the SDRAM from the battery power signal, the self-refresh circuit being configured to deassert the battery power on signal to direct the power monitor to resume powering the SDRAM from the system power supply, and wherein the self-refresh module has a first switch that receives two sets of inputs,
 a first set comprising at least a subset of the self-refresh control signals, and
 a second set comprising external control signals from the memory controller,
 the first switch being configured, under control of the self-refresh circuit, to supply the first set to the SDRAM following receipt of the power down signal and the second set to the SDRAM when the power down signal has not been received.

6. The battery backup system of claim 5, wherein the first switch is configured to provide the first and the second sets when the SDRAM is powered by the system power supply.

7. The battery backup system of claim 6, further comprising:
 a second switch that receives two sets of inputs:
  a first input which is a CLK enable from the self-refresh circuit, and
  a second input set to ground;
 the second switch being configured under control of the self-refresh circuit to supply the first input when the SDRAM is powered by the system power supply and the second signal when the SDRAM is powered by the battery power signal.

8. The battery backup system of claim 5, wherein the self-refresh control signals comprise:
 row address strobe;
 column address strobe;
 chip select;
 write enable; and
 clock enable.

9. A battery backup method for use with an SDRAM intended to operate from a system power supply, comprising:
 detecting status of the system power supply; and
 when the status shows that the system power supply is about to fail:
 issuing self-refresh control signals to the SDRAM that cause the SDRAM to perform a self-refresh operation without intervention of an external memory controller and without interrupting data operations when the system power supply is still within a working threshold; and
 supplying the SDRAM with a battery power signal in lieu of the system power supply, and keeping the SDRAM in self-refresh mode by keeping clock enable signal low with the battery power signal.

10. The battery backup method of claim 9, further comprising:
 initiating SDRAM self-refresh operations by a self-refresh module at a safe time when there are no active data operations being performed by the SDRAM.

11. The battery backup method of claim 9, further comprising:

determining a safe time to initiate SDRAM self-refresh operations when there are no active data operations being performed by the SDRAM by monitoring an auto-refresh signal generated by the external memory controller.

12. The battery backup method claim 9, further comprising:
 switching the system power supply or the battery power signal to the SDRAM depending on a power control signal generated by the power monitor in accordance with the status of the system power supply.

13. A battery backup method for use with an SDRAM intended to operate from a system power supply, comprising:
 detecting status of the system power supply;
 when the status shows that the system power supply is about to fail:
 issuing self-refresh control signals to the SDRAM that cause the SDRAM to Perform a self-refresh operation without intervention of an external memory controller when the system power supply is still within a working threshold,
 supplying the SDRAM with a battery power signal in lieu of the system power supply, and keeping the SDRAM in self-refresh mode by keeping clock enable signal low with the battery power signal;
 at a safe time, asserting a battery power on signal that is coupled to a power monitor that performs the detecting and supplying steps, the battery power on signal directing the power monitor to begin powering the SDRAM from the battery power signal;
 deasserting the battery power on signal to direct the power monitor to resume powering the SDRAM from the system power signal;
 switching a first set of signals comprising the self-refresh control signals to the SDRAM when the SDRAM is powered by the battery power signal; and
 switching a second set comprising external control signals from the memory controller to the SDRAM when the SDRAM is powered by the system power signal.

14. The battery backup method of claim 13, wherein the self-refresh control signals comprise:
 row address strobe;
 column address strobe;
 chip select; and
 write enable.

15. A computer program product for use in conjunction with a computer system, the computer program product comprising a computer readable storage medium and a computer program mechanism embedded therein, the computer program mechanism, comprising:
 a program module that directs an SDRAM, connected to a host computer and intended to operate from a system power supply, to function in a specified manner, the program module including instructions for:
 detecting status of the system power supply; and
 when the status shows that the system power supply is about to fail:
 issuing self-refresh control signals to the SDRAM that cause the SDRAM to perform a self-refresh operation without intervention of an external memory controller and without interrupting data operations when the system power supply is still within a working threshold; and
 supplying the SDRAM with the battery power signal in lieu of the system power supply, and keeping the SDRAM in self-refresh mode by keeping clock enable signal low with the battery power signal.

16. A battery backup system for use with an SDRAM intended to operate from a system power supply, comprising:

a battery configured to provide a battery power signal;

a power monitor configured to detect status of the system power supply and, when the system power supply is about to fail, to generate a power down signal and subsequently supply the SDRAM with the battery power signal in lieu of the system power supply; and a self-refresh module configured, in response to the power down signal, to issue self-refresh control signals to the SDRAM that cause the SDRAM to perform a self-refresh operation without intervention of an external memory controller, wherein the self-refresh module has a self-refresh circuit configured, in response to the power down signal, to determine a safe time and then, at the safe time, assert a battery power on signal to begin powering the SDRAM from the battery power signal, the self-refresh circuit being configured to deassert the battery power on signal and resume powering the SDRAM from the system power supply, and wherein the self-refresh module has a switch that receives at least a subset of the self-refresh control signals and is configured to supply said subset of the self-refresh control signals to the SDRAM following receipt of the power down signal and external control signals to the SDRAM when the power down signal has not been received.

17. A battery backup method for use with an SDRAM intended to operate from a system power supply, comprising:

detecting status of the system power supply;

when the status shows that the system power supply is about to fail:

issuing self-refresh control signals to the SDRAM that cause the SDRAM to perform a self-refresh operation without intervention of an external memory controller when the system power supply is still within a working threshold, supplying the SDRAM with a battery power signal in lieu of the system power supply, and keeping the SDRAM in self-refresh mode by keeping clock enable signal low with the battery power signal;

at a safe time, asserting a battery power on signal that performs the detecting and supplying steps, and powering the SDRAM from the battery power signal;

deasserting the battery power on signal and resuming powering the SDRAM from the system power signal;

switching at least a subset of self-refresh control signals to the SDRAM when the SDRAM is powered by the battery power signal; and switching external control signals to the SDRAM when the SDRAM is powered by the system power signal.

* * * * *